(12) United States Patent
Kalte et al.

(10) Patent No.: US 10,394,989 B2
(45) Date of Patent: Aug. 27, 2019

(54) METHOD FOR CREATING AN FPGA NETLIST

(71) Applicant: dSPACE digital signal processing and control engineering GmbH, Paderborn (DE)

(72) Inventors: Heiko Kalte, Paderborn (DE); Dominik Lubeley, Verl (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 15/585,335

(22) Filed: May 3, 2017

(65) Prior Publication Data

US 2017/0329877 A1    Nov. 16, 2017

(30) Foreign Application Priority Data

May 10, 2016 (EP) ..................... 16168899

(51) Int. Cl.
    *G06F 17/50* (2006.01)
(52) U.S. Cl.
    CPC ........ *G06F 17/505* (2013.01); *G06F 17/5027* (2013.01); *G06F 17/5054* (2013.01)
(58) Field of Classification Search
    CPC ............. G06F 17/5027; G06F 17/5054; G06F 17/5022; G06F 11/273; G06F 15/7867; G06F 17/5031; G06F 2217/84; G06F 2217/86; G06F 17/505; G06F 17/5081; G06F 17/5009; G06F 17/5077; G06F 11/263; G06F 12/0875; G06F 15/8015;
    (Continued)

(56) References Cited

U.S. PATENT DOCUMENTS 5,764,079 A    6/1998  Patel et al.
9,235,425 B2   1/2016  Kalte
                (Continued)

FOREIGN PATENT DOCUMENTS

EP    2 765 528 A1    8/2014

OTHER PUBLICATIONS

European Search Report for European Application No. 16168899.9 dated May 10, 2016, with English translation.
(Continued)

*Primary Examiner* — Binh C Tat
(74) *Attorney, Agent, or Firm* — Muncy, Geissler, Olds & Lowe, P.C.

(57) ABSTRACT

A method for creating an FPGA netlist generated from an FPGA source code and at least one shadow register. The FPGA source code defines at least one function and at least one signal. The shadow register is assigned to the at least one signal, and is arranged and provided to store the value of the assigned signal at runtime. An option for reading out the stored signal value at runtime is provided. The function defined in the FPGA source code is not changed by the shadow register. The function described by the FPGA source code is executed by the FPGA, and a functional decoupling of the shadow register from the function described in the FPGA source code is provided. Via the decoupling, the shadow register maintains the signal value stored at the time of the decoupling while the function described in the FPGA source code is being executed.

15 Claims, 9 Drawing Sheets

(58) Field of Classification Search
CPC .. G06F 17/5045; G06F 9/3005; G06F 9/3016; G06F 9/3017; G06F 9/30181; G06F 9/30185; G06F 9/3802; G06F 9/3818; G06F 9/3834; G06F 9/3836; G06F 9/3838; G06F 9/3855; G06F 9/3873; G06F 9/3885; G06F 9/3889; G06F 9/3897; G06F 9/4401; G06F 9/4411; G06F 9/445; G06F 13/22; G06F 13/4291; G06F 17/504; G06F 17/5072; G06F 2217/06; G06F 11/25; G06F 15/7864; G06F 19/00; G06F 3/05; G06F 5/01; G06F 7/32; G06F 7/38; G06F 8/34; G06F 9/382; G06F 9/4403; G06F 9/44505; G06F 9/455; G06F 17/5036; G06F 17/5063; G06F 21/50; G06F 21/85; G06F 2217/08; G06F 2217/68; G06F 2221/032; G01R 31/2853; G01R 31/31717; G01R 31/3177; G05B 2219/23258; H03K 19/17748; H03K 19/17756; H03K 19/1776
USPC .................................................. 716/100–108
See application file for complete search history.

(56) References Cited

U.S. PATENT DOCUMENTS

| | | | |
|---|---|---|---|
| 2010/0146338 A1 | 6/2010 | Schalick et al. | |
| 2010/0218146 A1* | 8/2010 | Platzker | G06F 17/505 716/103 |
| 2012/0200315 A1* | 8/2012 | Dimond | G06F 17/5054 326/39 |
| 2015/0347669 A1* | 12/2015 | Kalte | G06F 17/5027 716/134 |

OTHER PUBLICATIONS

Hutchings et al., "Rapid Post-Map Insertion of Embedded Logic Analyzers for Xilinx FPGAs", IEEE 22$^{nd}$ Annual International Symposium on Field-Programmable Custom Computing Machines, DOI 10.1109/FCCM.2014.29, pp. 72-79 (2014).

Stephanie Tapp, "Configuration Readback Capture in UltraScale FPGAs", Xilinx All Programmable, www.xilinx.com, XAPP1230 (v1.1), pp. 1-24 (Nov. 20, 2015).

* cited by examiner

- S110: Create copy of the source code
- S120: Determine minimum required bit widths of the constants
- S130: Propagate minimum required bit widths through the source code
- S140: Determine signal to which a shadow register is to be assigned
- S150: Test whether the value of the signal can be determined from values of shadow registers that have already been inserted
- S160: Insert or reference shadow register with decoupling mechanism
- S170: Insert and arrange readout mechanism
- S180: Synthesize the netlist from the source code with the inserted shadow registers
- S190: Generate a bit stream from the netlist
- S200: Load the bit stream on an FPGA and execute the function on the FPGA
- S210: Decouple the shadow register at runtime and read out the shadow register

Fig. 9

METHOD FOR CREATING AN FPGA NETLIST

This nonprovisional application claims priority under 35 U.S.C. § 119(a) to European Patent Application No. 16168899.9, which was filed in Europe on May 10, 2016, and which is herein incorporated by reference.

BACKGROUND OF THE INVENTION

Field of the Invention

The present invention relates to a method for creating a netlist for an FPGA.

Description of the Background Art

The real-time simulation of complex, dynamic models places high demands on even modern computing nodes due to the tight time constraints. In automotive hardware-in-the-loop simulations (HIL), such models are used primarily where rapid control loops must be closed. This is the case, for instance, in the simulation of cylinder pressure sensors, which play an ever greater role in reducing fuel consumption and exhaust emissions. However, short cycle times and low latencies are also indispensable for controlled systems that have high dynamics, such as electric motors, for example. These are virtually impossible to achieve in practice with CPU-based simulations now.

Field Programmable Gate Arrays (FPGAs) can support computing nodes in real-time simulation by taking over the calculation of dynamic components of a model. Even rigorous real-time demands can be met with ease through the use of FPGAs due to the high flexibility and the capability of parallel processing of signals. The FPGAs can serve as hardware accelerators for CPUs of computing nodes. Accordingly, very dynamic components of the environment model are moved out into the FPGA, for example, so that sufficiently precise and fast reaction times continue to be ensured for the control unit. An FPGA netlist is normally generated in a build process based on an FPGA model in a hardware description language.

Due to increasing requirements for precision, the models of controlled systems are becoming increasingly complex, and thus also difficult to manage. In the automotive HIL environment, such models generally are produced with the Matlab/Simulink tool set from The MathWorks Inc. Simulink offers a block-based view of such models in the form of a block diagram. Model components can be combined into subsystems in a block diagram, and connected to one another with signals. The flow of data between these blocks is represented by signal lines here.

An FPGA-based simulation can be modeled in a block diagram with Simulink with the aid of the Xilinx System Generator (XSG) and the FPGA Programming Blockset from dSPACE, in a manner analogous to CPU-based simulation.

In contrast to CPU simulation, however, this model is not translated into an iterative programming language, but instead into an FPGA netlist that describes a customer-specific digital circuit. The FPGA netlist can be translated into an FPGA configuration data stream.

From EP2765528A1, which corresponds to U.S. Pat. No. 9,235,425, which is incorporated herein by reference, a method for reading out variables from FPGAs at runtime is known.

In some readout techniques, the data are read out directly from the working registers. In the case of readout at the runtime of the FPGA, this is disadvantageous since it often is not possible to read out a register at a specific point in time. Since the working registers are continuously overwritten with current values at runtime, it often is not possible to acquire a value that is present at a specific point in time.

SUMMARY OF THE INVENTION

It is therefore an object of the invention to improve the state of the art.

The invention concerns a method for creating an FPGA netlist, wherein the netlist is generated from an FPGA source code and at least one shadow register, wherein the FPGA source code defines at least one function and at least one signal, wherein the shadow register is assigned to the at least one signal, and is arranged and provided to store the value of the assigned signal at runtime, wherein an option for reading out the stored signal value at runtime is provided and arranged, wherein the function defined in the FPGA source code is not changed by the shadow register, wherein the netlist is provided to be loaded on an FPGA and executed by the FPGA, wherein the function described by the FPGA source code is executed by the FPGA, wherein a functional decoupling of the shadow register from the function described in the FPGA source code is provided and arranged, wherein, by means of the decoupling, the shadow register maintains the signal value stored at the time of the decoupling while the function described in the FPGA source code is being executed.

According to an exemplary embodiment of the invention, a data processing device with a processor unit is additionally specified, wherein the data processing device is designed to carry out the above method.

Also provided is a computer program product with computer-implemented instructions that executes the steps of the above method after loading and execution in a suitable data processing device.

A digital storage medium is provided, with control signals that are read out electronically and that can interact with a programmable data processing device in such a manner that the above method is executed on the data processing device.

The netlist can be converted into a bit stream and loaded on an FPGA. The FPGA can then execute the function defined in the FPGA source code. As a result of the decoupling, it becomes possible to read out precisely the value that was current at the time of the decoupling, even if a readout of the signal values takes place with a delay. "At runtime" should be understood here to mean that the function defined in the FPGA source code continues to be executed and the signal value continues to be updated while the shadow register is decoupled and maintains the value that was current at the time of decoupling. The decoupling can be initiated by a trigger signal. To this end, the decoupling mechanism is connected to the trigger signal in the FPGA netlist. Alternatively, the shadow register can be decoupled by default, and be briefly connected to the function in response to a trigger signal. Then the signal value that is current at the time of the trigger signal is stored in the shadow register, and the shadow register is decoupled from the function again.

The result of the method according to the invention is thus an FPGA netlist, wherein at least one shadow register is defined in the netlist, wherein at least one function and at least one signal is defined in the FPGA netlist, wherein the shadow register is connected to the at least one signal and is arranged and provided to store the value of the assigned signal at runtime, wherein the netlist is intended to be loaded on an FPGA and to be executed by the FPGA, wherein an option for reading out the signal value stored in the shadow register at the runtime of the FPGA is provided and arranged in the netlist, wherein a functional decoupling of the shadow register from the signal is provided and arranged, wherein the shadow register maintains, due to the decoupling, the signal value stored at the time of the decoupling while the FPGA executes the function.

In an embodiment, the FPGA source code defines a multiplicity of signals, wherein a multiplicity of shadow registers are each assigned to one signal, wherein the functional decoupling is provided and arranged to synchronously decouple the multiplicity of shadow registers.

Due to the synchronous decoupling, it becomes possible to read out from the FPGA a multiplicity of signal values that are simultaneously present at runtime. Often the synchronous readout of multiple signal values from an FPGA is not possible. Due to the synchronously decouplable shadow registers, signal values that are simultaneously present can be stored and sequentially read out. Thus, a consistent data set of variables that are simultaneously present can be captured.

In an exemplary embodiment is an FPGA netlist, wherein a multiplicity of signals can be defined in the FPGA netlist, wherein a multiplicity of shadow registers can each be assigned to one signal, wherein the functional decoupling can be provided to synchronously decouple the multiplicity of shadow registers.

In an embodiment, the enable signal of the shadow register or the clock signal of the shadow register is disconnected for the purpose of decoupling.

Due to the interruption of the enable signal of the shadow register, the shadow register is no longer actualized at runtime. This represents a very simple decoupling option for one or more shadow registers.

Due to the interruption of the clock signal of the shadow register, the shadow register accepts no more changes, so that the state of the register is virtually frozen. The value stored in the shadow register can nevertheless be read out in various ways.

The result of the exemplary embodiment is an FPGA netlist, wherein provision is made in the netlist to disconnect the enable signal of the shadow register or the clock signal of the shadow register for the purpose of decoupling.

In an embodiment, the FPGA source code is present as a graphical model or as textual code.

FPGA source code often is present in the form of a graphical model, for example as a block diagram in a development environment. Simulink from The MathWorks represents an example of such block diagrams. In graphical source code, shadow registers can easily be inserted as additional registers, wherein the additional registers are connected to the assigned signal and can be functionally decoupled from the signal at runtime by means of a decoupling mechanism that likewise is inserted. An alternative form of FPGA source code is text code, for example VHDL or Verilog. Shadow registers can easily be inserted as additional registers into textual source code as well, wherein the additional registers are connected to the assigned signal and can be functionally decoupled from the signal at runtime by means of a decoupling mechanism that likewise is inserted.

In an embodiment, the shadow register is inserted into the FPGA source code or into a copy of the FPGA source code.

Due to the insertion of the shadow register directly into the FPGA source code, the creation of a netlist is especially simple, since only the FPGA source code must be translated into a netlist. Due to the insertion of the shadow register into a copy of the FPGA source code, the original FPGA source code remains untouched. This is advantageous when the method is meant to be transparent for the user. The user thus does not notice that a shadow register has been inserted, but the advantages can nevertheless be utilized during readout of the signal value at runtime.

In an embodiment, a netlist is generated from the source code, and the shadow register is inserted into the netlist.

Due to the insertion of the shadow registers into the netlist, the FPGA source code remains unchanged without the need for a copy to be made. The netlist with the shadow registers can continue be used thereafter like any other netlist. For example, it can be converted into a bit stream and then be loaded on an FPGA. The netlist into which the shadow register is loaded can be present here as a simple netlist or with additional information through mapping, placing, and/or routing.

In an embodiment, the shadow register is automatically inserted and assigned to the signal.

Due to the automation, the user is relieved of the task of inserting the shadow register and assigning it to the signal. Especially when there are a multiplicity of signals, each of which is to have a shadow register assigned to it, automation is highly advantageous.

In an embodiment, a test is made automatically as to whether the signal is already assigned to a shadow register at another location, in which case no additional shadow register is assigned to this signal.

The automatic test prevents a multiplicity of shadow registers from being inserted for one signal and assigned to that signal. Especially when the FPGA source code becomes large, which is to say is composed of many lines of text or, as a graphical model, is composed of a multiplicity of hierarchy levels, a manual test is laborious and error-prone, and therefore the automatic test is advantageous.

In an embodiment, at least two shadow registers are inserted and assigned to the signal, wherein the first shadow register is provided and arranged for storing a current signal value at runtime while the second shadow register is decoupled.

With two shadow registers, it is possible to capture an old signal value in the first shadow register and simultaneously to record a current signal value in the second shadow register. This can be used, for example, when the process of reading out the shadow register takes multiple FPGA clock cycles or cannot be carried out immediately. Then a current value can be stored in the second shadow register during readout of the first shadow register.

Multiple shadow registers can also represent a save window. In this case, a current signal value is stored in one shadow register, and an old signal value is stored in the other shadow register. In response to a trigger signal, the shadow registers can be decoupled simultaneously. This makes it possible to read out the signal value before the trigger signal.

In an embodiment, a save window can be used to capture a signal value that follows a trigger signal. In this case, the shadow registers are decoupled sequentially after a predetermined time period.

By means of three or more shadow registers, both variants can be used simultaneously. In this way, it becomes possible to capture and to read out the signal value before and after a trigger signal.

The result of the exemplary embodiment is an FPGA netlist, wherein at least two shadow registers are defined in the FPGA netlist and to which a signal is assigned, wherein the first shadow register is provided and arranged for storing a current signal value at runtime while the second shadow register is decoupled.

In an embodiment, when the netlist is created, a readout of the shadow register through an external and/or internal readback interface of the FPGA is provided and arranged.

Reading out the shadow register through an internal or external readback interface represents a convenient option for readout. In this embodiment, in particular, very little is required in the way of logic and routing resources of the FPGA for readout. The shadow register can be placed directly next to the assigned signal by the implementation tools. As a result, the change is minimal as compared to a netlist with no shadow register inserted.

In an embodiment, a multiplicity of shadow registers are inserted, wherein the multiplicity of shadow registers are connected to form a shift register chain and are provided and arranged to be read out through an external interface of the FPGA.

In an embodiment, a multiplicity of shadow registers are inserted, wherein an address decoder for reading out the multiplicity of shadow registers through an external interface of the FPGA is provided and arranged.

Readout through an external interface typically permits a higher data throughput than a readback interface. Consequently, this form of readout is advantageous when it is often the case that many signal values are to be read out at runtime.

In an embodiment, logic is inserted in addition to the shadow register, wherein the logic is provided and arranged for the purpose of emitting a trigger signal in the event of a change of the signal value at runtime, wherein the trigger signal effects a decoupling of the shadow register.

Due to the incorporated logic circuitry, the decoupling can be triggered very rapidly when predetermined events occur. The trigger signal can then initiate the decoupling of one or more shadow registers immediately or with a predetermined delay. Such logic can be implemented in various ways. Examples of this are to be found in the exemplary embodiments.

In an embodiment, the following steps are carried out prior to insertion of the shadow register: determination of all constants in the FPGA source code that the first signal value is dependent upon, determination of the minimum required bit widths for the values of the constants found, reconfiguration of the constants to the minimum required bit width determined in each case, or later casting of constants to the minimum required bit width determined in each case, and propagating the bit widths through the entire FPGA model.

Constant blocks in graphical FPGA models and VHDL signals in VHDL models are often instantiated with a fixed bit width (e.g., 32 bits). When the values are subsequently defined, however, values that do not fully exhaust the value range of the specified bit width are most often used. The VHDL code generated from the graphical model likewise contains the full bit widths, independent of the bit widths actually required. When VHDL code is programmed by hand, the same procedure is usually followed.

This normally is not a problem, as the unneeded bits are optimized out by synthesis and implementation tools in order to save logic and routing resources.

The inserted shadow registers that are arranged for readout through an external interface are not optimized by the synthesis and implementation tools, however, since these tools do not optimize external accesses. To keep the resource consumption by the inserted shadow registers and the readout logic low, it is therefore advantageous to determine the minimum necessary bit width of the constants and all of the signals that depend on the constants. Then the shadow register can be implemented with the minimum necessary bit width of the assigned signal.

In an embodiment, the shadow register is protected from removal by optimization during the creation and/or further processing of the netlist.

Registers that have no outputs are generally optimized out, which is to say deleted, by the automated tools that are used for the creation and further processing of the netlist. This is generally useful, since these registers otherwise occupy resources in the FPGA without contributing to its function. The shadow registers inserted in the method according to the invention that are to be read out through a readback interface have no outputs and would therefore be deleted by the tools. The shadow registers are needed, however, in order to be able to read out the signal values from the FPGA at runtime. For this reason, it is advantageous to protect the shadow registers from removal by optimization. One option for achieving this is to provide the shadow registers and the signals contained therein with attributes, wherein the attributes are recognized by the tools and cause the tools not to carry out any optimization measures on the registers.

A combination of shadow registers protected from removal by optimization with the above-mentioned steps for determining the minimum necessary bit width is especially advantageous.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 9 shows the steps of a method according to the invention.

DETAILED DESCRIPTION

The method is explained in FIGS. 1 to 4 on the basis of schematic, graphical FPGA source code. It is a matter of course that the method can be carried out analogously with textual FPGA source code. In each case, it is possible to generate from the FPGA source code a netlist that can be loaded on an FPGA, by which means the FPGA can execute the function defined in the FPGA source code.

Figure 1:
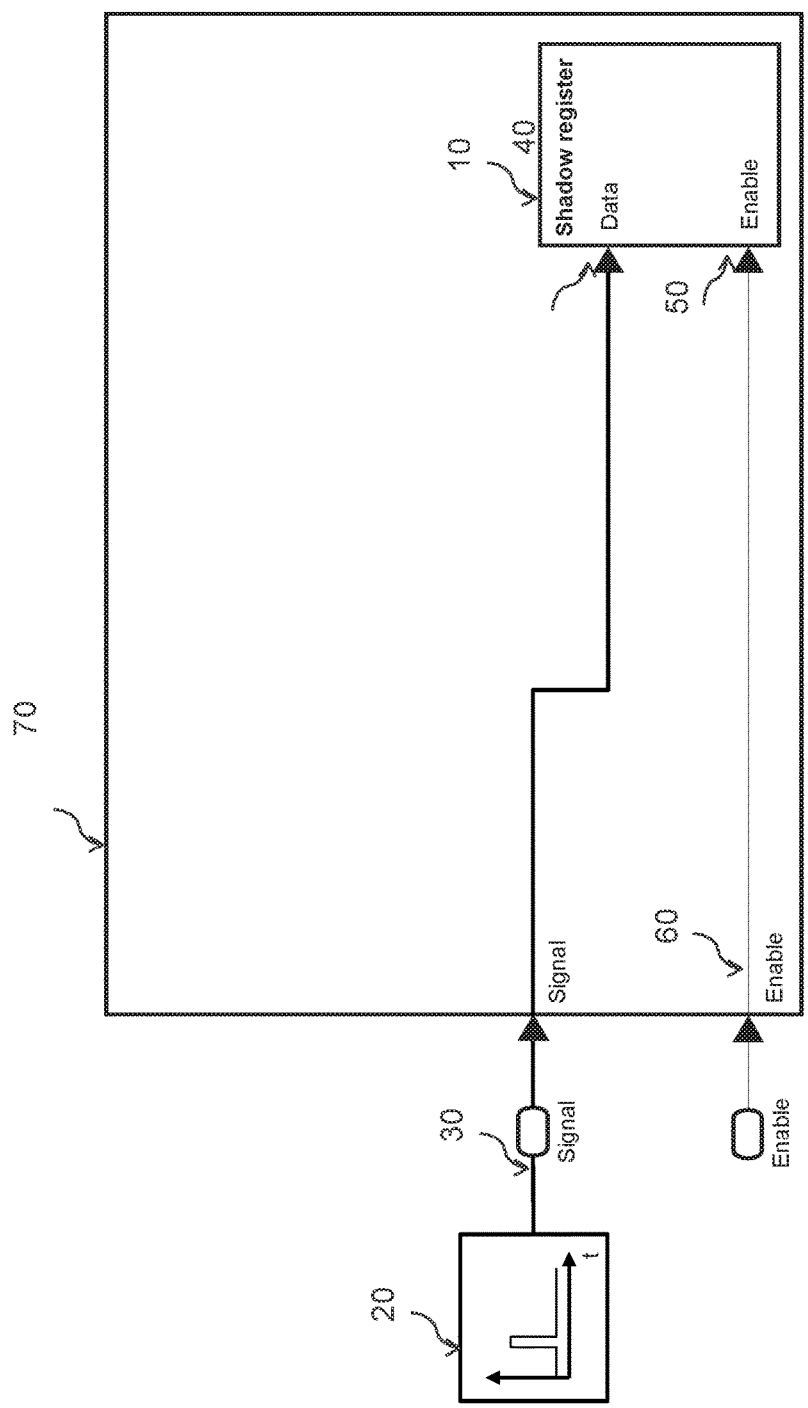
FIG. 1 shows a schematic view of an embodiment according to the invention.

The illustration in FIG. 1 shows a view of an embodiment having a shadow register 10 in free-running mode. A function with a signal 30 is defined in FPGA source code 20. The signal 30 is assigned to the shadow register 10. The shadow register 10 has two inputs 40, 50: A first input 40 for the signal 30 and a second input 50 for an enable signal 60. The shadow register 10 can be switched to the active state with the enable signal 60. Only in the active state does the shadow register 10 accept the current signal value of the assigned signal 30. The enable signal 60 can be continuously present and be disconnected only at the desired point in time in order to continuously store the current value in the shadow register. Alternatively, the enable signal 60 can be applied only briefly in order to continuously store in the shadow register the value of the signal 30 that is current at the point in time of the active enable signal. In this example, the part 70 inserted during the method includes the shadow register 10 and the lines for the signal 30 and the enable signal 60. The enable signal 60 can be applied to the FPGA from outside. However, it is also possible to have the enable signal 60 controlled by the FPGA.

Figure 2:
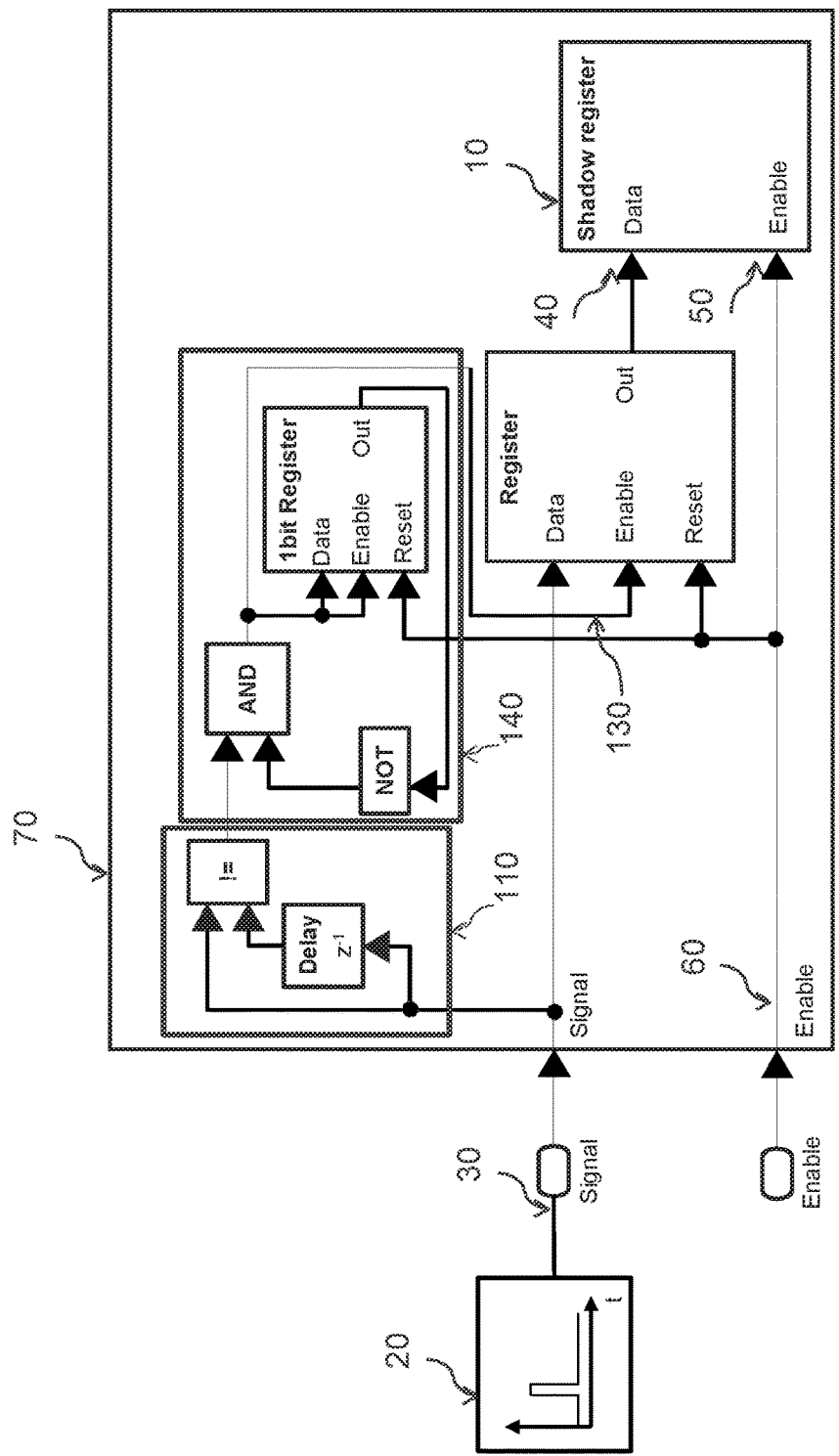
FIG. 2 shows a schematic view of an embodiment according to the invention.

An embodiment is shown in the illustration in FIG. 2. Only the differences from the illustration in FIG. 1 are explained below. A buffer register 100, which can also be viewed as a second shadow register, is connected to the signal 30 and the shadow register 10. Current signal values can be stored in the buffer register 100 while the shadow register is decoupled. A two-part logic circuit 110, 140 is connected to the signal 30 and the buffer register 100. The first part of the logic circuit 110 detects at runtime that a change in the signal value has taken place. In the event of a signal change detected by the first part of the logic circuit 110, the second part of the logic circuit 140 generates a trigger signal 130, which serves as an enable signal for the second register. The logic circuit 110, 140 is constructed such that the trigger signal 130 is generated for only one clock cycle when there is a change in the signal value. As a result, only the first changed signal value is stored in the buffer register 100. The enable signal 60 makes it possible for the signal value stored in the buffer register 100 to be transferred into the shadow register 10. The value can then be read out from the shadow register 10, for example through a readback interface. The enable signal 60 also serves as a reset signal for the logic circuit 110, 140 and the buffer register 100. The logic circuit 110, 140 is designed such that it does not generate a new trigger signal 130 until after receiving the reset signal. The reset of the buffer register 100 makes it possible to clearly distinguish in the data that has been read out whether a current value has been read out or only the initialization value of the register after a reset.

It is a matter of course that the trigger signal 130 can also be forwarded to other inserted circuits. In this way, one trigger signal can initiate the storage of a multiplicity of signal values. This is advantageous when a consistent set of signal values that are simultaneously present in the FPGA is to be acquired.

In this example, the part 70 inserted during the method includes the shadow register 10, the buffer register 100, and the two-part logic circuit 110, 140.

Figure 3:
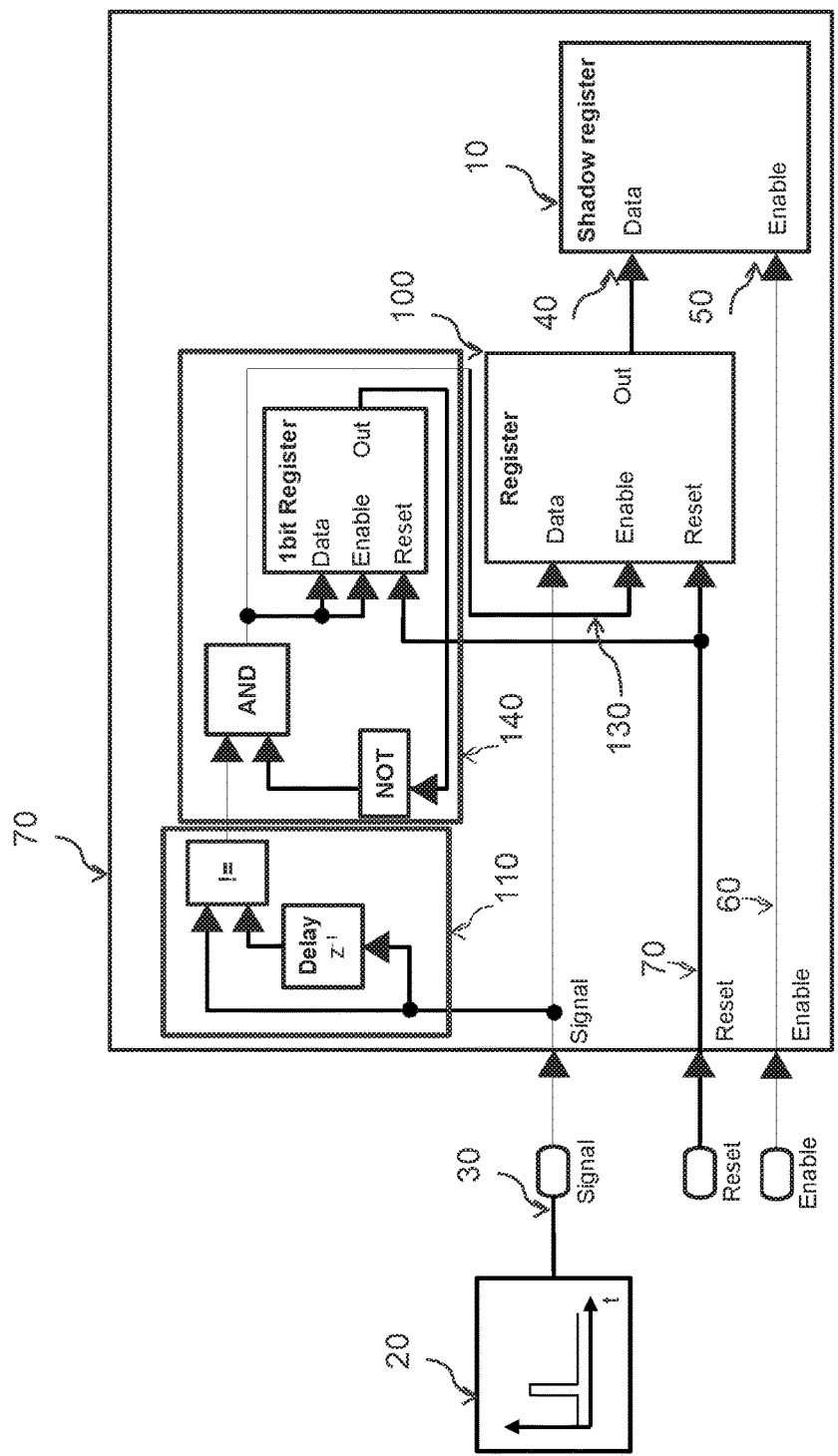
FIG. 3 shows a schematic view of an embodiment according to the invention.

An embodiment is shown in the illustration in FIG. 3. Only the differences from the illustration in FIG. 2 are explained below. The enable signal 60 here does not serve as a reset signal for the second register 100 and the two-part logic circuit 110, 140. The enable signal 60 only serves to transfer the signal value into the shadow register 10. The reset signal 70 for the logic circuit 110, 140 and the buffer register 100 is separate from the enable signal 60, and can be controlled from outside or inside the FPGA, depending on implementation.

Figure 4:
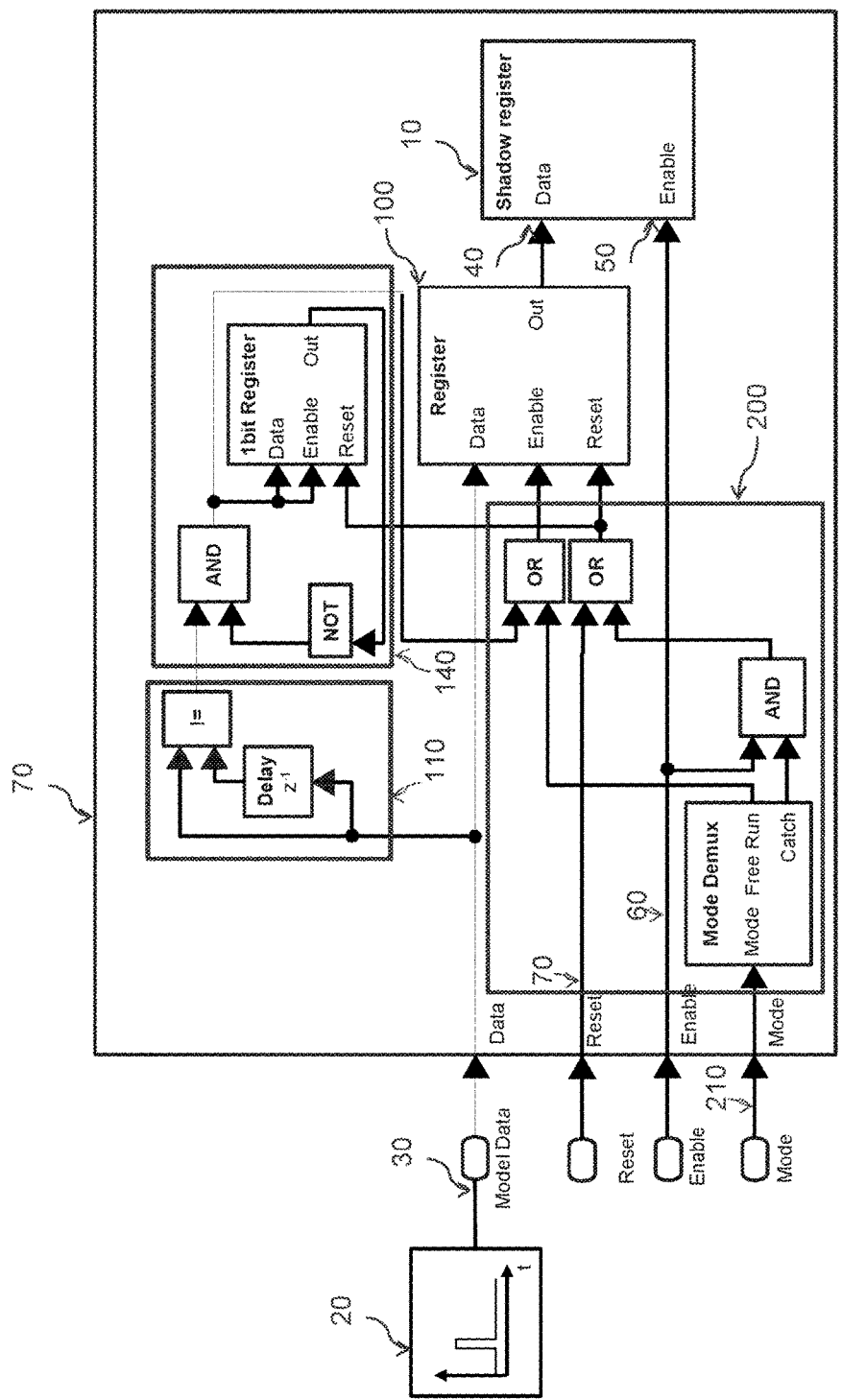
FIG. 4 shows a schematic view of an embodiment according to the invention.

An embodiment is shown in the illustration in FIG. 4. Only the differences from the illustration in FIG. 3 are explained below. Mode switching logic 200 is inserted. The mode switching logic 200 receives the reset signal 70, the enable signal 60, and a mode signal 210 as inputs. Depending on the value of the mode signal 210, the two-part logic circuit 110, 140 can be overridden so that the circuit behaves like the circuit from FIG. 1. In addition, depending on the mode signal 210, the enable signal 60 is used as a reset signal for the buffer register 100 and the two-part logic circuit 110, 140 so that the circuit behaves like the circuit of the embodiment from FIG. 2. If no mode signal 210 is present, then the circuit behaves like the circuit of the embodiment from FIG. 3. The exemplary embodiment thus represents a combination of the first three embodiments, and the behavior can be chosen by means of the mode signal 210 at runtime. This is advantageous if it is not yet certain which behavior is desired when the netlist is created.

Figure 5:
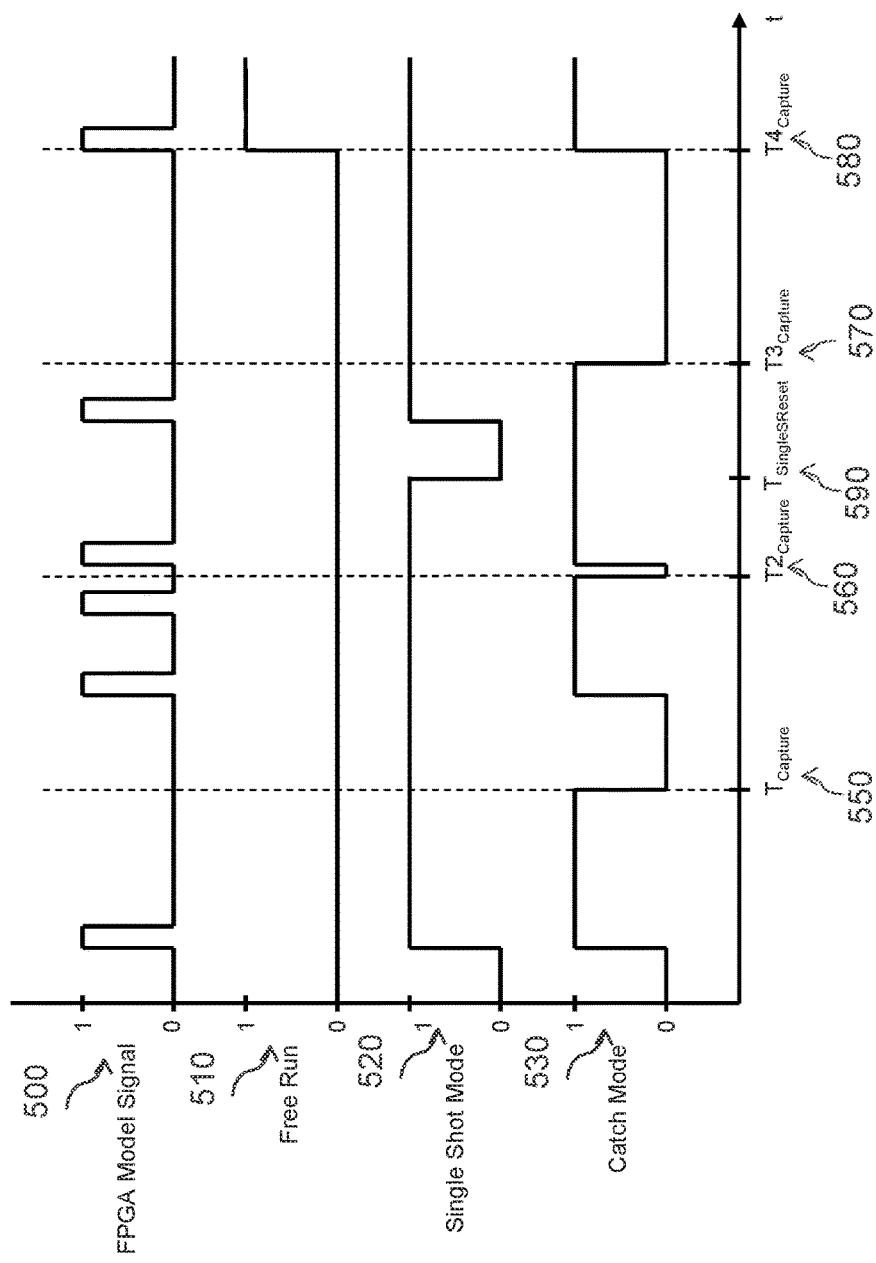
FIG. 5 shows a schematic representation of the behavior of the exemplary embodiments.

The illustration in FIG. 5 shows a schematic representation of the behavior of some of the embodiments.

The top line 500 shows an exemplary signal trace of the signal 30. Over time, the signal changes between 0 and 1 a number of times.

The second line 510 shows the value of the shadow register 10 using the example of the exemplary embodiment from FIG. 1. The enable signal 60 is activated briefly at four different times 550, 560, 570, 580. Since the value of the shadow register is only updated when the enable signal 60 is active, the value of the shadow register 10 remains 0 until the signal value 30 is 1 and the enable signal is active at the same time. The value can then be read out from the shadow register.

The third line 520 shows the value of the buffer register 100 using the example of the exemplary embodiment from FIG. 3. The first time the signal value of the signal 30 changes, the two-part logic circuit 110, 140 actuates the trigger signal 130, and the current value is transferred to the buffer register 100. The reset signal 70 becomes active at a fifth time 590. The reset signal 70 sets the value of the buffer register 100 to 0 and resets the two-part logic circuit 110, 140 so that a trigger signal 130 is again generated the next time the signal value of the signal 30 changes. Each time the enable signal 60 is active at one of the four indicated times 550, 560, 570, 580, the current value of the buffer register 100 at that point in time is transferred into the shadow register 10 and can be read out from there.

The fourth line 530 shows the value of the buffer register 100 using the example of the exemplary embodiment from FIG. 2. The first time the signal value of the signal 30 changes, the two-part logic circuit 110, 140 actuates the trigger signal 130, and the current value is transferred to the buffer register 100. Each time the enable signal 60 is active at one of the four indicated times 550, 560, 570, 580, the current value of the buffer register 100 at that point in time is transferred into the shadow register 10 and can be read out from there. At the same time, the enable signal 60 sets the value of the buffer register 100 to 0 and resets the two-part logic circuit 110, 140 so that a trigger signal 130 is again generated the next time the signal value of the signal 30 changes.

Figure 6:
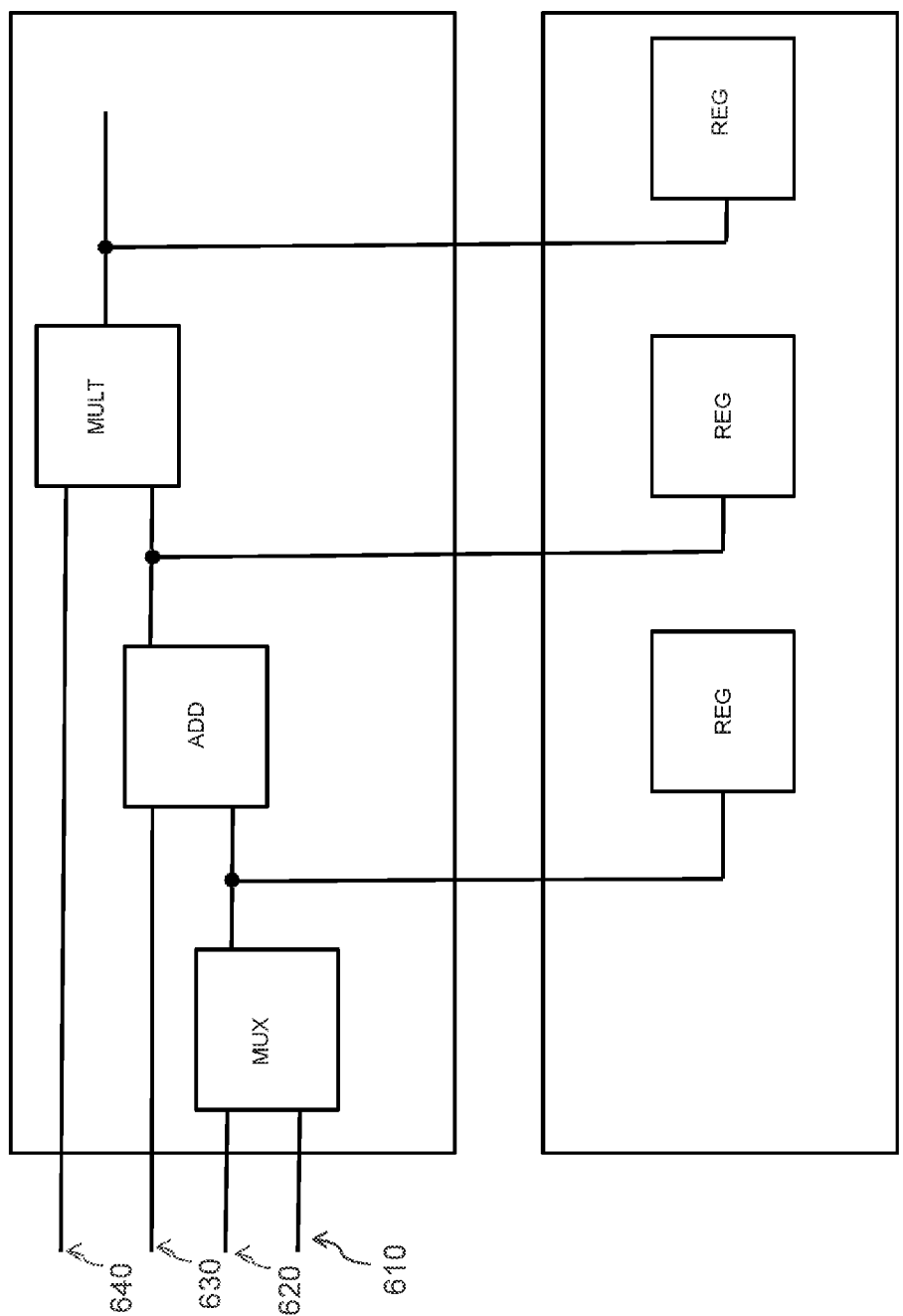
FIG. 6 shows a schematic representation of a netlist, with preparation for readout of the registers through a readback interface.

FIG. 6 shows a schematic representation of a netlist, with preparation for readout of the registers through a readback interface. The netlist includes three logic blocks MUX, ADD, MULT, and multiple lines. Two inputs 610, 620 of the netlist are routed into two inputs of the first logic block MUX. The output of the first logic block MUX is connected to a first input of the second logic block ADD. A third input 630 of the netlist is connected to a second input of the second logic block ADD. The output of the second logic block ADD is connected to a first input of the third logic block MULT. A fourth input 640 of the netlist is connected to a second input of the third logic block MULT. The output of the third logic block forms the output of the netlist. Inserted into this netlist are three shadow registers REG. Each shadow register REG is assigned to one output signal apiece of a logic block. The shadow registers REG are provided and arranged for readout through a readback interface, which is why no readout logic is inserted into the netlist. The shadow registers can be functionally disconnected from the logic blocks in the same clock step by means of a decoupling circuit. In this way, a consistent data set can be captured in the shadow registers.

Figure 7:
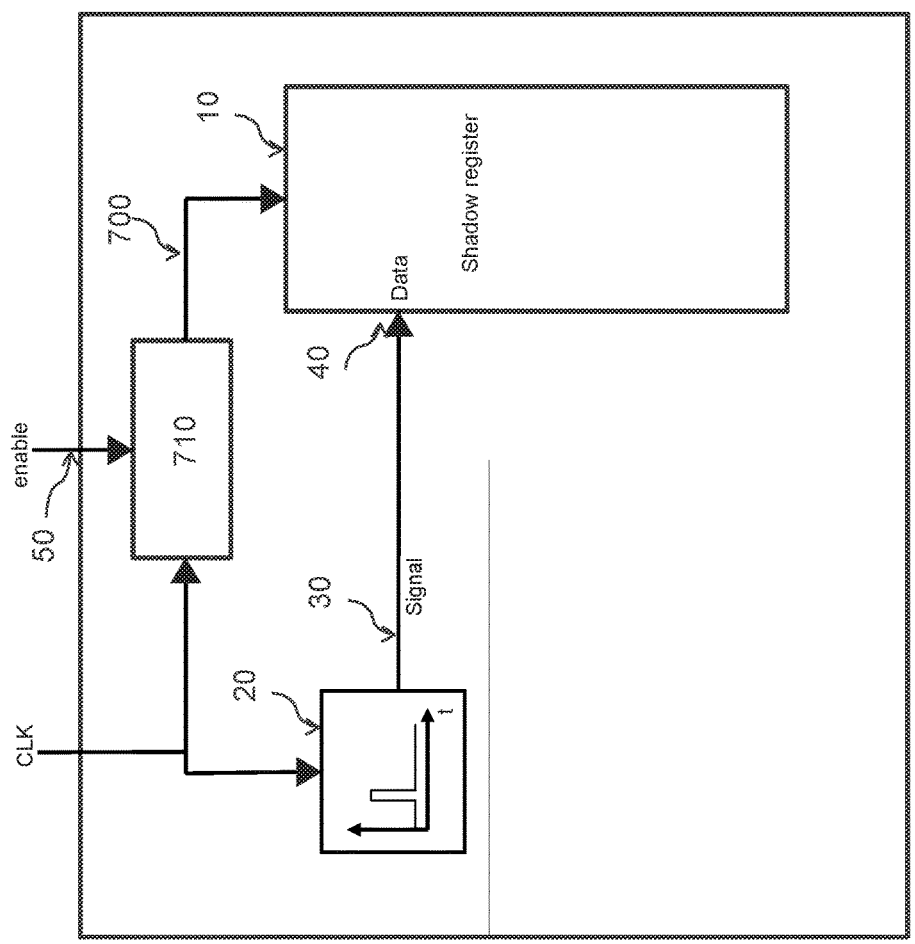
FIG. 7 shows a schematic decoupling circuit with disconnection of the clock line.

FIG. 7 shows a schematic decoupling circuit with disconnection of the clock signal. The clock signal 700 of the shadow registers is connected by an inserted decoupling mechanism 710 to the clock network CLK of the signal assigned to the shadow register. The decoupling mechanism can be operated from inside and/or outside the FPGA at runtime and disconnect the clock signal. The signal 30 assigned to the shadow register 10 from the FPGA source code 20 is permanently connected to the signal input 40 of the shadow register 10. The shadow register 10 only accepts a current signal value if the decoupling mechanism 710 connects the clock signal of the shadow register 10 to the clock network CLK.

Figure 8:
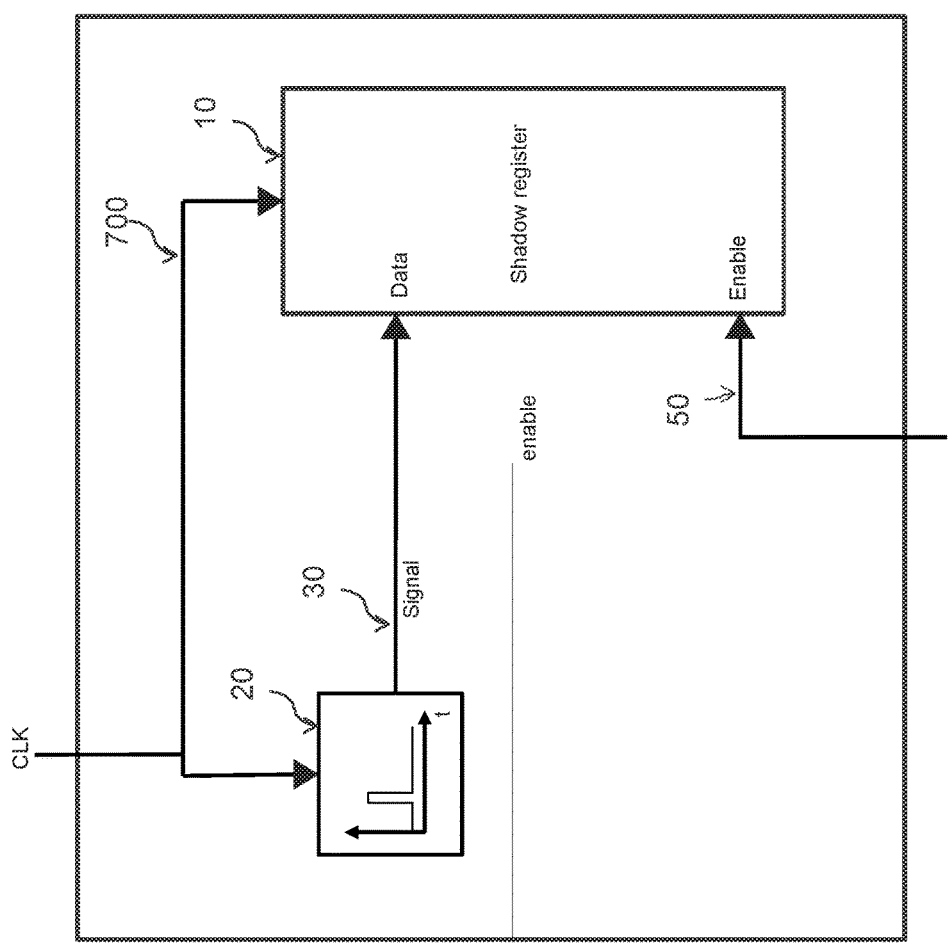
FIG. 8 shows a schematic decoupling circuit with disconnection of the enable line.

FIG. 8 shows a schematic decoupling circuit with disconnection of the enable signal. The clock signal 700 of the shadow register 10 is connected directly to the clock network CLK in this embodiment. For decoupling of the shadow register 10, a decoupling mechanism is inserted and connected to the enable input 50 of the shadow register 10. The decoupling mechanism can be operated from inside and/or outside the FPGA at runtime and disconnect the enable signal.

Even FPGA programs with multiple clock domains can be operated reliably, which is to say without metastable states, in the ways described above. For this purpose, in the case of decoupling with disconnection of the clock signal, the shadow register is connected to the clock network with which the assigned signal is also operated. When there are a multiplicity of shadow registers that are assigned to different signals, the clock lines of the shadow registers are connected to the applicable clock network of the assigned signals. In the case of decoupling with disconnection of the enable line, a separate enable signal with correct clock domain crossing is inserted into the FPGA netlist for each clock domain and is connected to the enable ports of the shadow registers of the applicable clock domains. A clock domain crossing can be correctly traversed by means of, e.g., double registers.

FIG. 9 shows the steps of a method according to the invention. Some steps here are mandatory, other steps are optional. In a first optional step S110, a copy of the source code is created. In a second optional step S120, the minimum required bit widths of the constants in the source code or the copy of the source code are determined. In a third optional step S130, the minimum required bit widths determined in the second step S120 are propagated through the source code. In a fourth mandatory step S140, a signal 30 is determined to which a shadow register 10 is to be assigned. This step can take place in an automated way through an algorithm or through user input. In a fifth optional step S150, a test is made as to whether the value of the signal determined in the fourth step S140 can be determined from values of shadow registers that have already been inserted. In a sixth mandatory step S160, a shadow register 10 is inserted for the signal 30 determined in the fourth step S140. In addition, a decoupling mechanism is inserted and arranged for the shadow register 10, or the shadow register 10 is connected to a decoupling mechanism that has already been inserted. If it was ascertained in the fifth step S150 that the value of the signal 30 determined in the fourth step S140 can be determined from shadow registers that have already been inserted, then no shadow register is inserted in the sixth step S160, but instead reference is made to the already-inserted shadow registers from which the value of the signal can be determined. In a seventh mandatory step S170, a readout mechanism is inserted and arranged for the shadow register 10 inserted in the sixth step S160. The inserting and arranging of the readout mechanism can include, for example, an instruction to the implementation tools is inserted into the source code to the effect that readout through a readback interface is to be made possible on the FPGA on which the netlist is to be loaded. The fourth to seventh steps can be repeated multiple times in order to assign shadow registers to a multiplicity of signals. For example, the fourth to seventh steps can be automatically processed repeatedly by an algorithm, wherein the algorithm systematically processes all signals defined in the source code.

In a mandatory eighth step S180, a netlist is synthesized from the source code. It should be noted that the eighth step S180 can also be carried out before the fourth step S140. In any case, the netlist contains the information of the original source code as well as the inserted shadow registers with the arranged decoupling mechanism and the arranged readout mechanism. In an optional ninth step S190, the netlist generated in the eighth step S180 is converted into a bit stream, which then, in an optional tenth step S200, can be loaded onto an FPGA and can be executed there. At the runtime of the FPGA, the shadow register 10 inserted in the sixth step S160 can then, in an optional eleventh step S210, be decoupled from the function of the original source code by the decoupling mechanism and read out through the readout mechanism arranged in the seventh step S170. The mandatory steps of the method make possible the reliable readout at the runtime of the FPGA of the value of the signal 30 determined in the fourth step S140.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for creating an FPGA netlist, the method comprising:
   generating the FPGA netlist from an FPGA source code and at least one shadow register, the FPGA source code defining at least one function and at least one signal, the shadow register being defined in the FPGA netlist;
   assigning the shadow register to the at least one signal, the shadow register being provided to store a signal value of the assigned signal at runtime;
   providing an option for reading out the stored signal value at runtime;
   providing the netlist to be loaded on an FPGA and executed by the FPGA;
   executing the function described by the FPGA source code by the FPGA; and
   by a functional decoupling of the shadow register, decoupling the shadow register from the function described in the FPGA source code such that the signal value stored in the shadow register at the time of decoupling is unchanged while the function described in the FPGA source code is being executed; and
   outputting the signal value stored in the shadow register that is unchanged since the time of decoupling.

2. The method according to claim 1, wherein the FPGA source code defines a multiplicity of signals, wherein a multiplicity of shadow registers are each assigned to one signal, wherein the functional decoupling is provided to synchronously decouple the multiplicity of shadow registers.

3. The method according to claim 1, wherein the enable signal of the shadow register or the clock signal of the shadow register is disconnected for the purpose of decoupling.

4. The method according to claim 1, wherein the FPGA source code is present as a graphical model or as textual code.

5. The method according to claim 1, wherein the shadow register is inserted into the FPGA source code or a copy of the FPGA source code.

6. The method according to claim 1, wherein a netlist is generated from the source code, and wherein the shadow register is inserted into the netlist.

7. The method according to claim 1, wherein the shadow register is automatically inserted and assigned to the signal.

8. The method according to claim 1, wherein a test is made automatically as to whether the signal is already assigned to a shadow register at another location in the source code, in which case no additional shadow register is assigned to this signal.

9. The method according to claim 1, wherein at least two shadow registers are inserted and assigned to the signal, wherein the first shadow register is provided and arranged for storing a current signal value at runtime while the second shadow register is decoupled.

10. The method according to claim 1, wherein, when the netlist is created, a readout of the shadow register through an external or internal readback interface of the FPGA is provided and arranged.

11. The method according to claim 1, wherein a multiplicity of shadow registers are inserted, wherein the multiplicity of shadow registers are connected to form a shift register chain and are read out through an external interface of the FPGA.

12. The method according to claim 1, wherein a multiplicity of shadow registers are inserted, wherein an address decoder for reading out the multiplicity of shadow registers through an external interface of the FPGA is provided.

13. The method according to claim 1, wherein logic is inserted in addition to the shadow register, wherein the logic emits a trigger signal in an event of a change of the signal value at runtime, and wherein the trigger signal effects a decoupling of the shadow register.

14. The method according to claim 1, wherein the following steps are carried out prior to insertion of the shadow register:
   determining all or substantially all constants in the FPGA source code that the first signal value is dependent upon;
   determining minimum required bit widths for the values of the constants found;
   reconfiguring the constants to the minimum required bit widths determined in each case, or later casting of constants to the minimum required bit widths determined in each case; and
   propagating the bit widths through the FPGA source code.

15. The method according to claim 1, wherein the shadow register is protected from removal by optimization during the creation and/or further processing of the netlist.

* * * * *